(12) United States Patent
Babhadiashar et al.

(10) Patent No.: US 10,542,642 B2
(45) Date of Patent: Jan. 21, 2020

(54) ANTI EMF RADIATION PROTECTIVE HOUSING

(71) Applicant: DenZ Engineering Group, LLC, Los Gatos, CA (US)

(72) Inventors: Navid Babhadiashar, Los Gatos, CA (US); Adam Teso, San Jose, CA (US); Reza Shahmoradi, Campbell, CA (US)

(73) Assignee: DENZ ENGINEERING GROUP, LLC, Los Gatos, CA (US)

(*) Notice: Subject to any disclaimer, the term of this patent is extended or adjusted under 35 U.S.C. 154(b) by 0 days.

(21) Appl. No.: 16/370,490

(22) Filed: Mar. 29, 2019

(65) Prior Publication Data
US 2019/0307026 A1 Oct. 3, 2019

Related U.S. Application Data

(60) Provisional application No. 62/650,836, filed on Mar. 30, 2018.

(51) Int. Cl.
*H05K 9/00* (2006.01)
(52) U.S. Cl.
CPC .......... *H05K 9/0003* (2013.01); *H05K 9/009* (2013.01); *H05K 9/0073* (2013.01)
(58) Field of Classification Search
CPC .............................. H05K 9/009; H05K 9/0003
See application file for complete search history.

(56) References Cited

U.S. PATENT DOCUMENTS

| | | | | |
|---|---|---|---|---|
| 3,390,491 A * | 7/1968 | Hayden | ................... | E04H 15/20 174/379 |
| 4,785,136 A * | 11/1988 | Mollet | ................... | G06F 1/182 174/363 |
| 5,908,043 A * | 6/1999 | Paes | ................... | E04B 1/92 135/115 |
| 6,011,504 A * | 1/2000 | Tan | ................... | H05K 9/0001 174/379 |
| 6,140,576 A * | 10/2000 | Kanne | ................... | H05K 9/0001 135/136 |
| 8,530,756 B1 * | 9/2013 | Winch | ................... | H05K 9/0001 174/382 |
| 8,859,913 B2 * | 10/2014 | Judy | ................... | H05K 9/0043 174/378 |
| 8,872,042 B2 * | 10/2014 | Cordes | ................... | H05K 9/0001 174/380 |
| 9,029,714 B2 * | 5/2015 | Winch | ................... | H05K 9/0001 174/377 |
| 2008/0094695 A1 * | 4/2008 | Simpson | ................... | B32B 17/10 359/359 |

* cited by examiner

*Primary Examiner* — Hung V Ngo
(74) *Attorney, Agent, or Firm* — Lewis Roca Rothgerber Christie LLP

(57) ABSTRACT

A protective housing for shielding an individual against electro-magnetic field (EMF) radiation includes a conductive mesh configured to be suspended from an elevated position, a conductive plane at a base of the protective housing and configured to be a grounding plane for the protective housing, the conductive plane and conductive mesh being configured to shield an interior space, defined by the conductive plane and conductive mesh when suspended, against EMF radiation, and a cable coupled to a circumference of the conductive mesh and configured to weigh down the conductive mesh and to electrically couple the conductive mesh to the conductive plane.

20 Claims, 21 Drawing Sheets

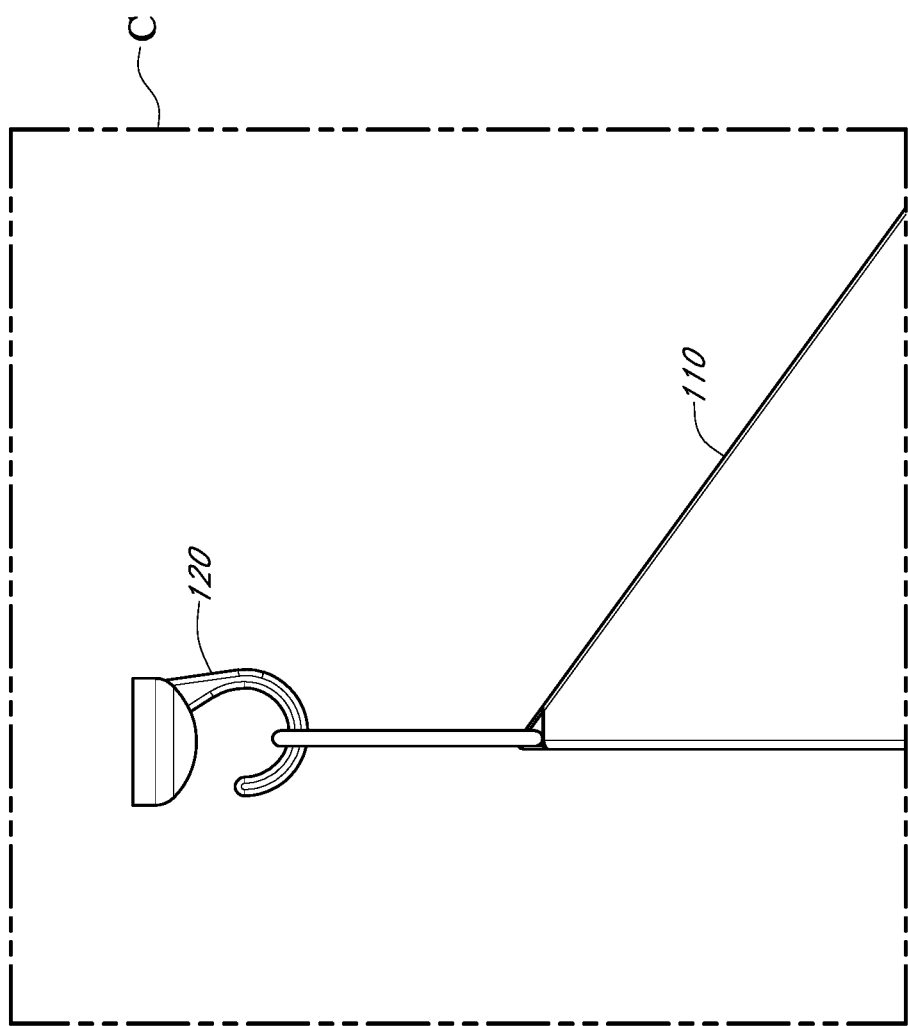

ANTI EMF RADIATION PROTECTIVE HOUSING

CROSS-REFERENCE TO RELATED APPLICATION(S)

This application claims priority to, and the benefit of, U.S. Provisional Application No. 62/650,836 ("ANTI-EMF RADIATION PROTECTIVE HOUSING"), filed on Mar. 30, 2018, the entire content of which is incorporated herein by reference.

FIELD

The present invention relates to the field of protective housings for shielding bodies from radiation.

BACKGROUND

In today's modern world, people are constantly exposed to electromagnetic field (EMF) radiation, which is typically emitted from electric power lines, cell phone base stations, wireless electronic devices such as cell phones and wifi-base stations, appliances such as microwave machines, etc. Recent studies on the effect of radiation on biological tissue have found that EMF radiation can penetrate infants and toddlers at a significantly higher magnitude than adults, due to the adolescent and immature bone density of young children, specifically in the skull region. While the scientific community has yet to come to a conclusive opinion on the potentially harmful effects of long term exposure to electromagnetic field radiation, there are a plethora of studies indicating that the potential for harm is something that cannot be ignored and should be researched further. Accordingly, many are concerned about the potential harmful effects that EMF exposure may have on their infants and toddlers, especially while the infant or toddler is sleeping.

What is desired is a device that reduces or minimizes the potential risks of EMF radiation to the vulnerable state of infants and toddlers, for those who deem the risk to be of substance.

The above information disclosed in this Background section is only for enhancement of understanding of the invention, and therefore it may contain information that does not form the prior art that is already known to a person of ordinary skill in the art

SUMMARY

Aspects of some embodiments of the present invention are directed toward an apparatus for cancelling, or substantially reducing the intensity of, incoming electromagnetic field radiation emitted from an external source such as a cell phone, a wifi device, power lines, industrial complexes, etc. In some embodiments, the apparatus is mountable on a crib/basinet as an accessory that my shield the crib from said electromagnetic field radiation.

According to some embodiments of the present invention, there is provided a protective housing for shielding an individual against electro-magnetic field (EMF) radiation, the protective housing including: a conductive mesh configured to be suspended from an elevated position; a conductive plane at a base of the protective housing and configured to be a grounding plane for the protective housing, the conductive plane and conductive mesh being configured to shield an interior space, defined by the conductive plane and conductive mesh when suspended, against EMF radiation; and a cable coupled to a circumference of the conductive mesh and configured to weigh down the conductive mesh and to electrically couple the conductive mesh to the conductive plane.

In some embodiments, the conductive mesh includes: a first conductive layer; and a second conductive layer overlapping with a portion of the first conductive layer, wherein the first conductive layer has a smaller mesh size and greater conductivity than the second conductive layer.

In some embodiments, the conductive mesh has a mesh size configured to permit the conductive mesh to be flexible to drape around an object placed within the interior space and to be breathable and see-through.

In some embodiments, the conductive mesh includes: a flexible and breathable fabric having an electrically-conductive coating, the flexible and breathable fabric including at least one of a polyamide, a polyester, cotton, polyethylene, and polypropylene, and the electrically-conductive coating includes at least one of silver (Ag), gold (Au), aluminum (Al), copper (Cu), chromium (Cr), iron (Fe), manganese (Mn), tin (Sn), titanium (Ti), tungsten (W), platinum (Pt), nickel (Ni), cobalt (Co), barium (Ba), indium (In), palladium (Pd), bismuth (Bi), niobium (Nb), selenium (Se), zinc (Zn), vanadium (V), mercury (Hg), and cadmium (Cb).

In some embodiments, the conductive mesh has a slit formed by a first edge and a second edge of the conductive mesh, the slit providing an opening to the interior space when the conductive mesh is suspended, the first and second edges being configured to be coupled together to close the opening.

In some embodiments, each of the first and second edges of the slit includes a plurality of magnets positioned along a corresponding one of the first and second edges, the plurality of magnets including an alternating pattern of shorter and stronger magnets and longer and weaker magnets.

In some embodiments, each one of the plurality of magnets being attached to the conductive mesh by being secured within sown slots along a corresponding one of the first and second edges.

In some embodiments, the cable includes: an electrically-conductive weighted rope.

In some embodiments, the cable includes: a plurality of conductive segments positioned within corresponding slots along a circumferential edge of the conductive mesh.

In some embodiments, the cable includes: a plurality of magnetic segments positioned within corresponding slots along a circumferential edge of the conductive mesh.

In some embodiments, the protective housing further includes: a suspender configured to suspend the conductive mesh from the elevated position, the suspender including a ring affixed to an end of the conductive mesh and an eyelet configured to be coupled to the ring and to the elevated position.

In some embodiments, the protective housing further includes: a frame coupled to the conductive mesh and configured to define a shape of conductive mesh.

In some embodiments, the frame has a circular shape, an oval shape, a rectangular shape, a trapezoidal shape, or a pentagonal shape.

In some embodiments, the frame includes: a central body configured to be coupled to the conductive mesh; a plurality of support members rotatably coupled to and extending away from the central body; and a plurality of securing members coupled to corresponding ones of the plurality of support members and configured to securely couple the frame to an object within the interior space.

In some embodiments, the central body is configured to be coupled to the conductive mesh, and the conductive mesh is configured to drape over the plurality of support members.

In some embodiments, each of the plurality of securing members includes: a main body having opposing lips protruding away from the main body and configured to surround a side of the object; and a fastening mechanism having a flat head configured to move between the opposing lips and having an adjustable head configured to adjust a position of the flat head between the opposing lips, wherein the securing member is configured to become fixedly coupled to the side of the object in response to an adjustment of the adjustable head, via a rotating tool, to clamp the side of the object between the lip of the opposing lips and the flat head.

In some embodiments, each of the plurality of securing members further includes: a sleeve portion configured to encompass and couple to an end of a corresponding one of the plurality of supporting members, the sleeve portion being coupled to the main body via one or more screws.

In some embodiments, each of the plurality of securing members includes: a clamp body; an overhanging telescopic hook extending from the clamp body and configured to engage a horizontal beam of the object; and a pair of resilient arms extending laterally from opposing sides of the clamp body and configured to engage vertical bars of the object.

In some embodiments, each of the pair of resilient arms has a protrusion extending from a corresponding resilient arm of pair of resilient arms in a direction orthogonal to an extension direction of the corresponding resilient arm, and the pair of resilient arms are configured to engage the vertical bars of the object by apply opposing lateral forces against the vertical bars via the protrusions.

In some embodiments, the central body includes: a sensing device configured to monitor the interior space of the protective housing and to be in wireless communication with a remote device external to the protective housing.

BRIEF DESCRIPTION OF THE DRAWINGS

The accompanying drawings, together with the specification, illustrate exemplary embodiments of the present invention, and, together with the description, serve to explain aspects of embodiments of the present invention. In the drawings, like reference numerals are used throughout the figures to reference like features and components. The figures are not necessarily drawn to scale. The above and other features and aspects of the present invention will become more apparent from the following detailed description of illustrative embodiments thereof with reference to the attached drawings, in which:

FIG. 7C illustrates a closer view of the region C of FIG. 7B;

DETAILED DESCRIPTION

The detailed description set forth below is intended as a description of example embodiments of a system and method for defect detection, provided in accordance with the present invention, and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Aspects of some embodiments of the present invention are directed to a universal anti electromagnetic field (EMF) radiation protective system (also referred to as an EMF protection system or protective housing) for encompassing and protecting an individual (e.g., an infant) inside the EMF protective system from external EMF radiation. In some embodiments, the EMF protection system utilizes a conductive fabric coupled to a grounding plane (e.g., grounding sheet or plate) to shield its interior space from external EMF radiation. In some examples, the encompassed entity may be a toddler, and infant, or an adolescent child.

Figure 1:
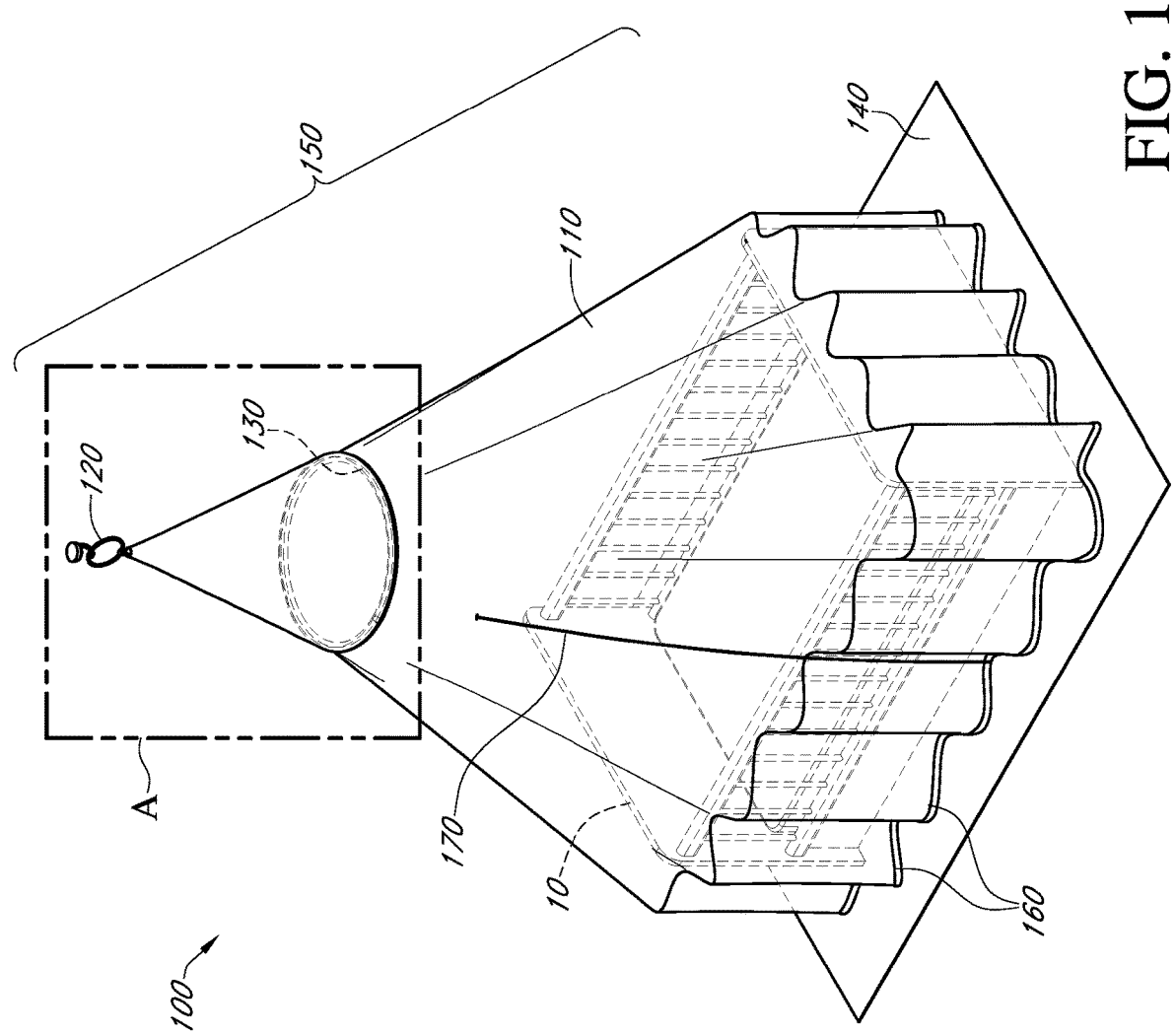
FIG. 1 illustrates a perspective view of an EMF protection system, according to some exemplary embodiments of the present invention.
Figure 2:
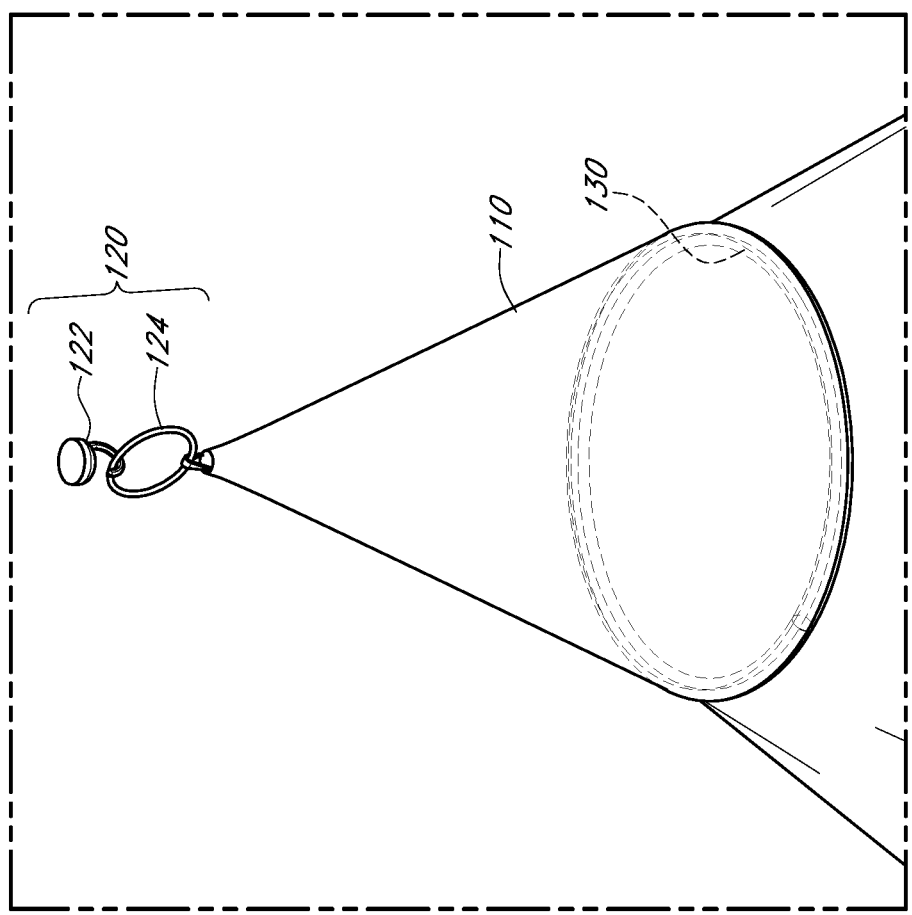
FIG. 2 illustrates a top portion of the EMF protection system within region A of FIG. 1.
Figure 3:
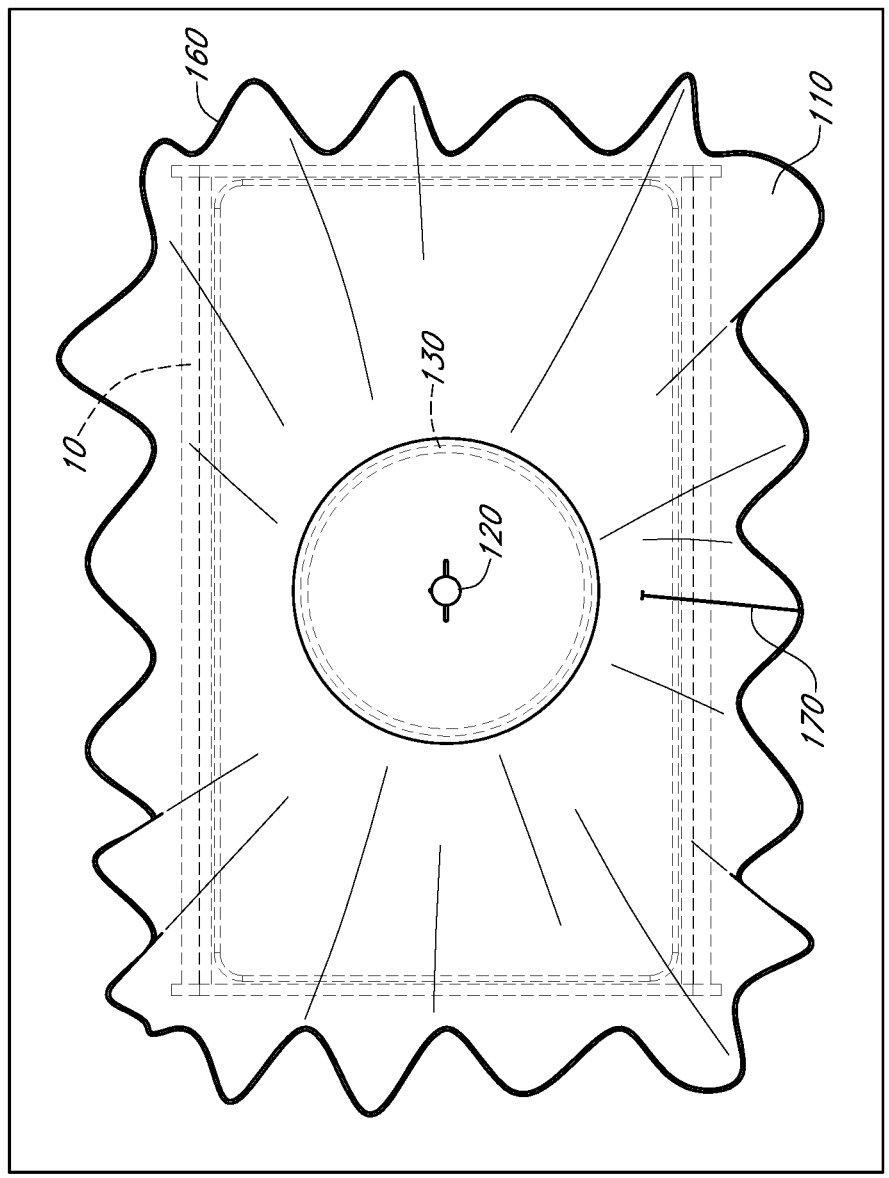
FIG. 3 illustrates a top view of the EMF protection system of FIG. 1.

FIG. 1 illustrates a perspective view of an EMF protection system 100, according to some exemplary embodiments of the present invention. FIG. 2 illustrates a top portion of the EMF protection system 100 within region A of FIG. 1. FIG. 3 illustrates a top view of the EMF protection system 100 of FIG. 1.

Referring to FIG. 1, the EMF protection system (e.g., protective housing) 100 includes a conductive mesh (e.g., a conductive fabric or an anti-EMF fabric) 110 for encompassing an object 10, a suspender 120 for supporting/suspending the conductive mesh 110 above the object 10 from an elevated position, a frame (e.g., an overhead structural frame) 130 for giving shape to the conductive fabric and defining an interior volume of the conductive mesh 110, a conductive plane (e.g., a conductive/grounding sheet or plate) 140 at the base of the EMF protection system 100 and configured to act as a grounding plane for EMF protection system 100, and a coupler configured to electrically couple the conductive mesh 110 to the conductive plane 140. According to some examples, an object (e.g., a crib or a bassinet) may be placed on top of the conductive plane 140 and within the interior space of the conductive mesh 110. In some embodiments, when suspended (e.g., hung from the ceiling), the conductive mesh 110, the frame 130, and the suspender 120 together form a canopy 150. The EMF protection system 100 further includes a cable (e.g., a conductive cable) 160 coupled to a circumference of the conductive mesh 110 and configured to both weigh down the conductive mesh 110 to provide suitable draping and to electrically connect the conductive mesh 110 to the grounding plane of the conductive plane 140.

The conductive mesh 110 is designed based on the principals of a faraday cage. According to some embodiments, the conductive mesh 110 includes one or more layers of a fine metal mesh or metallic fabric that are flexible, breathable, and at least partially see-through. The conductive outer surface that the conductive mesh 110 creates an electrically polar charge on either side of the conductive mesh 110 where, for example, one side of the outer surface is positively charged while the other side is negatively charged. This creates a net neutral electrical environment within the confines of the conductive mesh 110, thus effectively shielding the interior of the faraday cage from electromagnetic field signals. In some examples, the EMF protection system 100 may eliminate/cancel incoming EMF signals of about −120 dBm to about −30 dBm (e.g., about −120 dBm to about −50 dBm) in signal strength. This reduction in incoming EMF signals may be sufficient to prevent an off the shelf cell phone from receiving or transmitting phone calls when encompassed by the EMF protection system 100.

In addition to being conductive, it is desirable for the conductive mesh 110 to exhibit flexibility, breathability and (at least partial) transparency. For example, flexibility of the conductive mesh 110 allows it to take any suitable shape and to effectively contour/drape across the object 10. Breathability of the conductive fabric is desired for maintaining adequate air flow through the conductive mesh 110 and for maintaining a suitable temperature (e.g., a temperature substantially the same as the exterior ambient temperature) within the confines of the EMF protection system 100. Further, it may be desirable for the conductive mesh 110 to be at least partially transparent to allow an outside observer (e.g., a parent) to easily monitor the individual (e.g., the child) placed within the EMF protection system 100.

In some embodiments, the conductive mesh 110 includes a fabric having an electrically-conductive coating or a weave of conductive threads. In some examples, the base fabric material may include polyamides (e.g., Nylon 6 or Nylon 66), polyethylene terephthalate (PET, also referred to as polyester), cotton, polyethylene, polypropylene, a combination thereof, and/or the like. The fabric may be coated with, or have conductive threads including, an electrically conductive material including silver (Ag), gold (Au), aluminum (Al), copper (Cu), chromium (Cr), iron (Fe), manganese (Mn), tin (Sn), titanium (Ti), tungsten (W), platinum (Pt), nickel (Ni), cobalt (Co), barium (Ba), indium (In), palladium (Pd), bismuth (Bi), niobium (Nb), selenium (Se), zinc (Zn), vanadium (V), mercury (Hg), cadmium (Cb), and/or the like.

In some examples, the conductive fabric may have a mesh density of about 8 mesh/cm to about 47 mesh/cm. In some examples, the conductive mesh 110 may have a mesh size (e.g., opening size) of about 0.5 mm. The fabric thickness may be about 0.005 inches to about 0.009 inches (e.g. about 0.007 inches). The fabric may have a weight that is about 20 $g/m^2$ to about 34 $g/m^2$, and exhibit an electrical resistivity of about 0.7 ohm/cm to about 8 ohm/cm. As will be understood by a person of ordinary skill in the art, the values provided above are merely for illustrative purposes, and the present invention is not limited thereto. That is, the thickness, mesh size, material of the conductive mesh 110 may be suitably varied to balance electrical conductivity against flexibility, breathability, and visibility. For example, while increasing the fabric thickness and reducing the mesh size may reduce the resistivity of the conductive mesh 110 even further, thus yielding even greater EMF protection, it may also reduce its flexibility, breathability, and transparency, which may be undesirable in some applications.

Referring to FIGS. 1-3, in some embodiments, the EMF protection system 100 utilizes an overhead canopy design that may be suspended from an elevated position (e.g., hung from the ceiling or attached to a wall mount) via the suspender 120. In some examples, the suspender 120 may include an eyelet (or hook or any suitable securing mechanism) 122 coupled to a ring 124 that is affixed to an end (e.g., a canopy tip) of the conductive mesh 110.

According to some embodiments, the shape (e.g., the conical shape) of the flexible conductive mesh 110 is maintained by a frame (e.g., a structural frame) 130 that is vertically offset from the suspender 120 when suspended and positioned near the top of the canopy 150. In some embodiments, the frame 130 may be secured to conductive mesh the via ties located inside the canopy 150 that allow the ring to be removed for easy folding, transport, or storage. However, embodiments of the present invention are not limited thereto, and the frame 130 may be secured via any suitable securing mechanism. For examples, the frame 130 may be sown or adhered to the conductive mesh 110. In some embodiments, the frame 130 is ring shaped which allows the canopy 150 formed by the conductive mesh 110 to have a conical shape. However, embodiments of the present invention are not limited thereto, and the frame 130 may have any suitable shape, such as an oval, a rectangle, a trapezoid, a pentagon, and/or the like.

Figure 4:
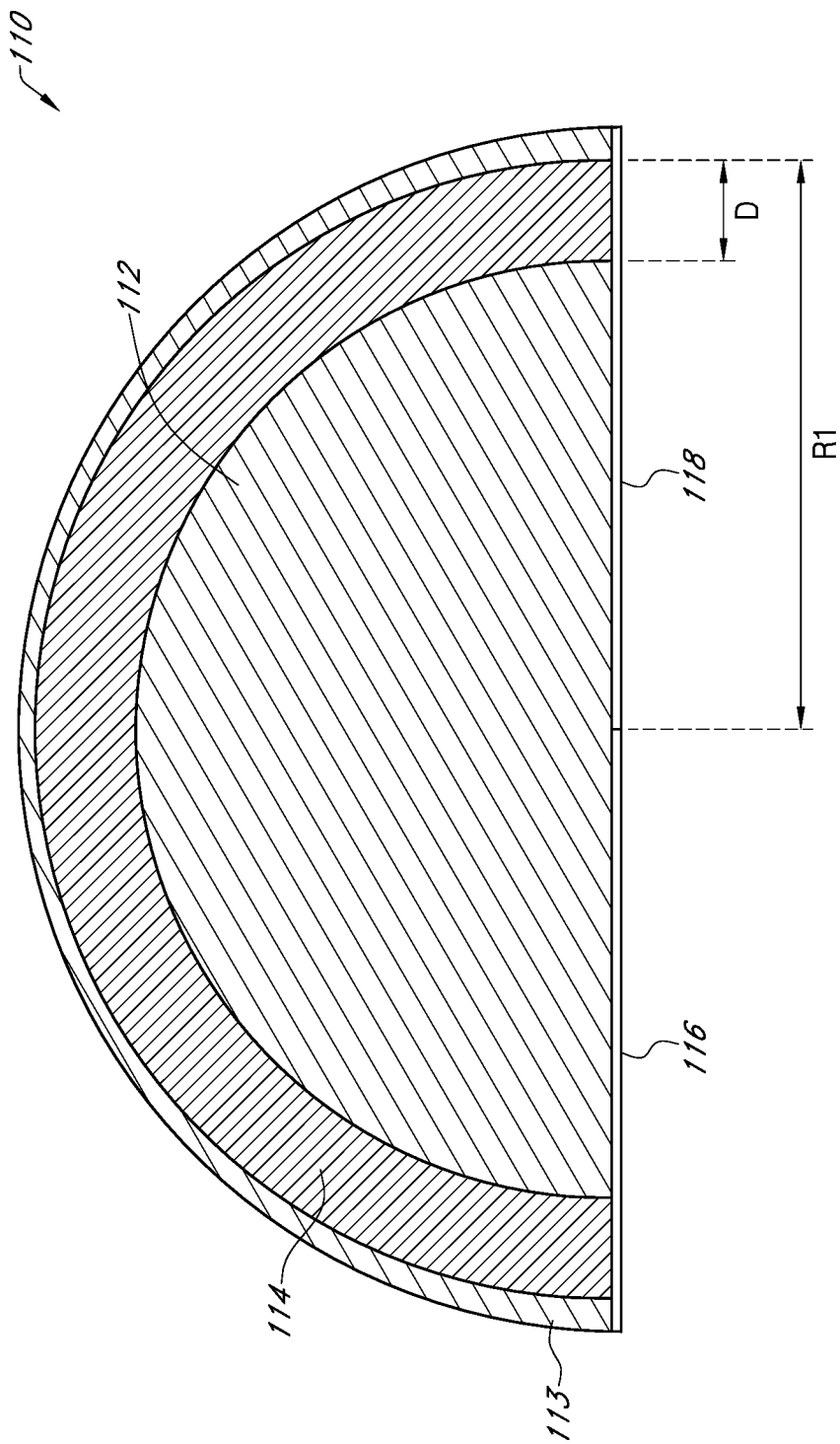
FIG. 4 illustrates a schematic view of the conductive mesh when laid out flat, according to some exemplary embodiments of the present invention.

FIG. 4 illustrates a schematic view of the conductive mesh 110 when laid out flat, according to some exemplary embodiments of the present invention.

According to some embodiments, in order to produce a canonical canopy 150, the conductive mesh 110 is cut into a half circle shape with its straight edges 116 an 118 being brought together to form a slit 170 that defines an opening to the interior of the EMF protection system 100, when suspended.

In some embodiments, the conductive mesh includes a first conductive layer (e.g., a base fabric) 112 and a second conductive layer (e.g., a supplemental fabric) 114 partially overlapping the first conductive layer 112, which serves to increase the electrical conductivity of the conductive mesh 110 and hence improve (e.g. increase) the EMF shielding of the EMF protection system 100. According to some embodiments, the first conductive layer 112 has a smaller mesh size and greater conductivity (e.g., higher silver content) than the second conductive layer 114.

In some examples, the second conductive layer 14 may have a substantially half-ring shape (e.g., a half annulus shape) that overlaps with (e.g., covers) the bottom portion of canopy 150. The second conductive layer 114 may be affixed to (e.g., sown onto and/or adhered to) the first conductive layer 112. By covering the bottom portion of the canopy 150, according to some examples, the second conductive layer 114 improves the EMF shielding effect near the area in which the infant or toddler may be resting, without meaningfully affecting the breathability and transparency of the canopy 150. However, embodiments of the present invention are not limited thereto, and the second conductive layer 114 may overlap with the first conductive layer 112 up to a mid-point of the canopy 150 or even near the top of the canopy, depending on the application of the canopy 150.

In some examples, the first conductive layer 112 of the conductive mesh 110 may have a radius R1 of about 80 inches to about 130 inches (e.g., about 103.5 inches), and the second conductive layer 114 of the conductive mesh 110 may have a radial width D of about 30 inches to about 60 inches (e.g., about 48 inches).

Figure 5A:
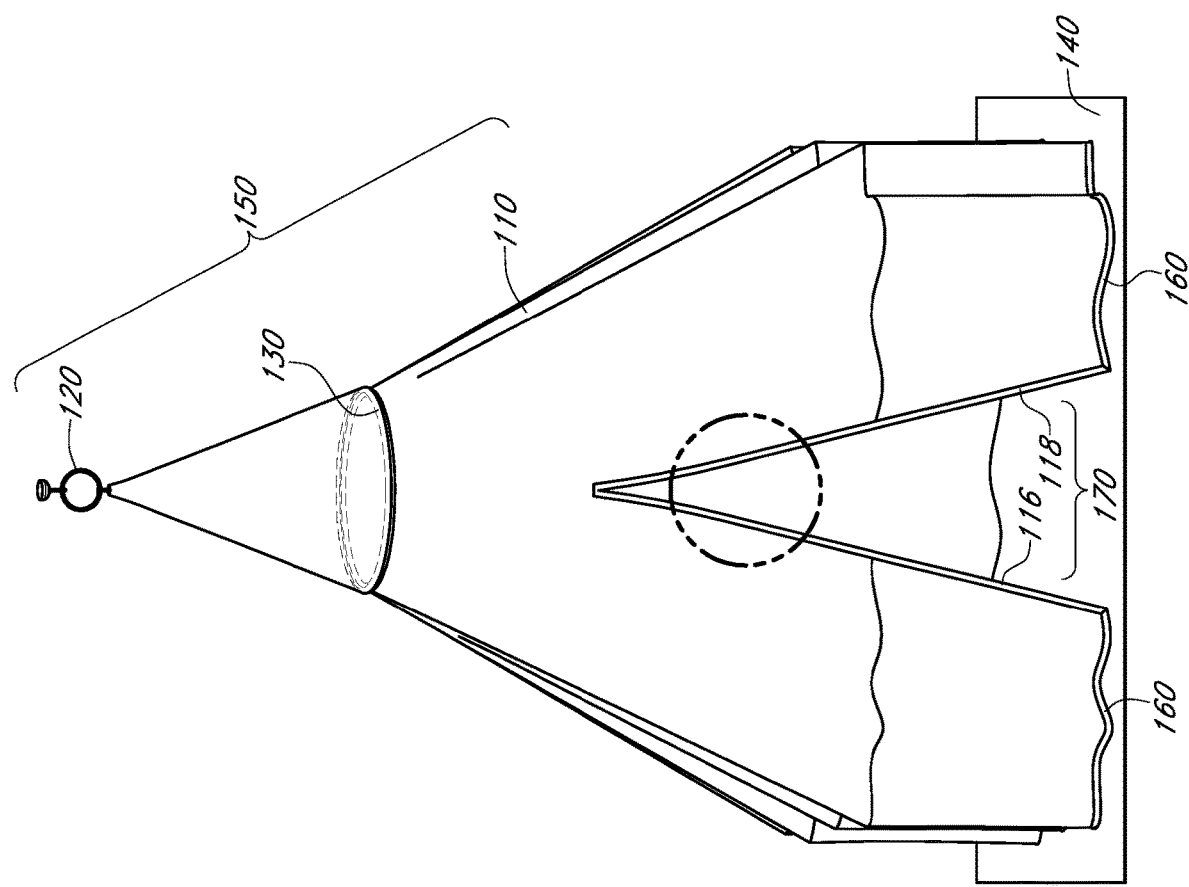
FIG. 5A illustrates a front view of the EMF protection system showing a slit defining an opening according to some exemplary embodiments of the present invention.
Figure 5B:
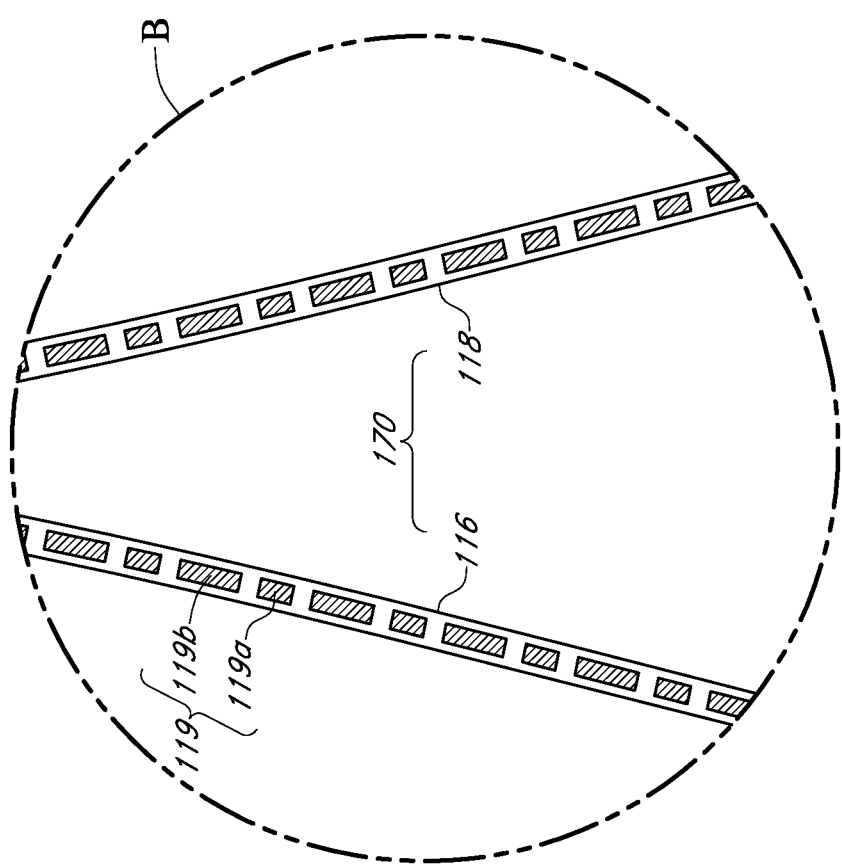
FIG. 5B illustrates a closer view of the region B of FIG. 5A, according to some exemplary embodiments of the present invention.

FIG. 5A illustrates a front view of the EMF protection system 100 showing the slit 170 defining an opening according to some exemplary embodiments of the present invention. FIG. 5B illustrates a closer view of the region B of FIG. 5A, according to some exemplary embodiments of the present invention.

Referring to FIGS. 5A-5B, the edges 116 and 118 of the conductive mesh 110 form an slit 170, when separated, that can provide access to the interior of the canopy 150. The edges 116 and 118 may also be coupled together (e.g., fastened together) via a suitable means to close the slit 170 (and hence close the opening) and enable proper shielding of EMF radiation. According to some embodiments, each of the edges 116 and 118 includes (e.g., has fastened to it) a plurality of magnets 119 that are lined along the corresponding edges 116/118. The magnets 119 may be brought together to ensure a close and tight connection between the edges 116 and 118 when the opening is close. Further, as the magnets 119 along the edge 116 are naturally drawn to the magnets 119 along the edge 118, they facilitate the self-closing of the slit 170.

In some embodiments, the magnets 119 along each of the edges 116 and 118 represent an alternating pattern of magnets (e.g., rare earth magnets) including shorter and stronger magnets 119a and longer and weaker magnets 119b. The pattern of magnets 119 at either side of the slit 170 (along the edges 116 and 118) may be mirrors of one another. The alternating pattern of magnets 119 may allow for optimal alignment of the edges 116 and 118 and ensure proper closure of the opening. In some examples, the long magnets (e.g., longer magnets) 119b are intended to do the alignment as their longer body provides more contact area that can be used to line up the edges 116 and 118. The short magnets (e.g., shorter magnets) 119a may be more powerful magnets than the long magnets 119b, and thus ensure that the connection between both edges 116 and 118 has adequate force to maintain closure. In some examples, the long magnets 119b may have the same strength as the short magnets 119a; however, this may lead to higher costs. In some examples, the short magnets 119a may be about 1 inch in length and the long magnets 119b may be about 2 inches to about 3 inches in length. The magnets 119 may be attached to the fabric by being secured within sown slots along the edges 116 and 118. However, embodiments of the present invention are not limited thereto, and the magnets 119 may be secured to the conductive mesh using any other suitable mechanism, such as an adhesive and/or the like. Further, in some examples, the magnets 119 may be replaced with conductive velcro or a metallic zipper that can seal the opening at the slit 170.

Figure 6B:
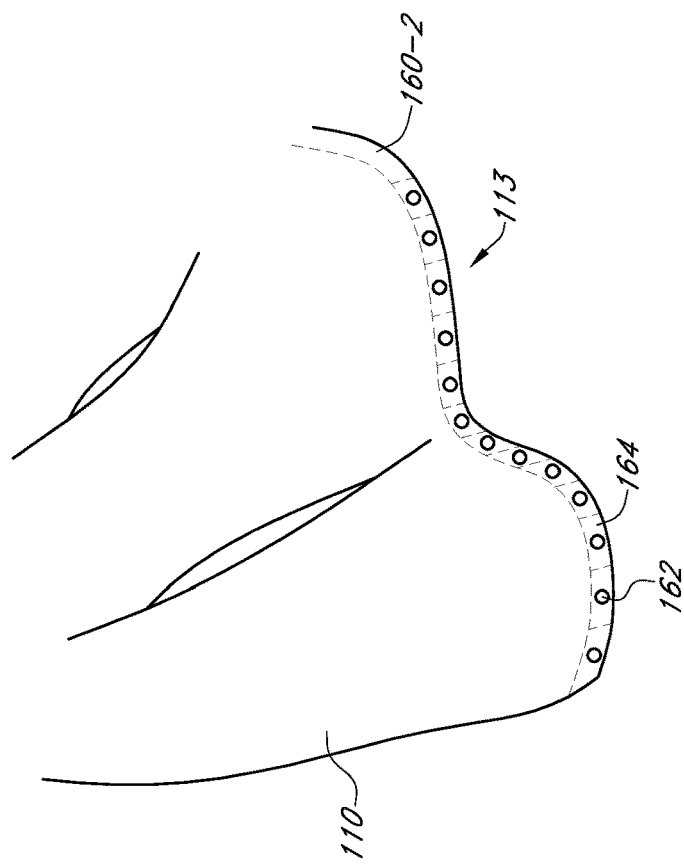
FIGS. 6A-6B illustrate a cable of the EMF protection system according to various exemplary embodiments of the present invention.
Figure 6A:
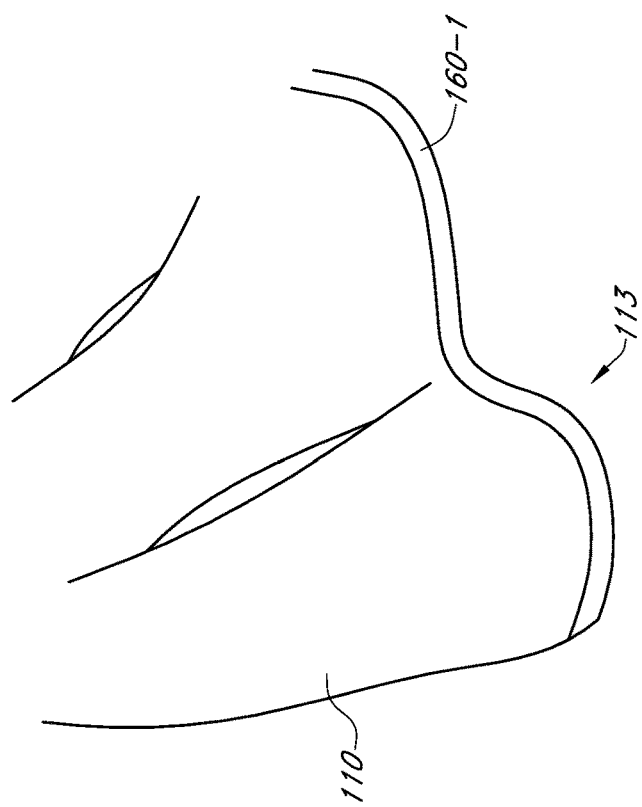

FIGS. 6A-6B illustrate the cable 160 according to various exemplary embodiments of the present invention.

Referring to FIGS. 4 and 6A-6B, in some embodiments, the cable (e.g., conductive cable) 160 is attached to the circumferential edge 113 of the conductive mesh 110 and is configured to be flexible and malleable to accommodate for the draping of the conductive mesh 110. The cable 160 may span the entire circumference of the conductive mesh 110. The cable 160 serves to not only weigh down the conductive mesh 110 to ensure a proper drape but also ensures proper contact with the conductive plane (e.g., grounding sheet) 140. In some embodiments, the cable may be made of electrically conductive material.

According to some embodiment, the cable 160 includes an electrically-conductive weighted rope (see, e.g., the cable 160-1 of FIG. 6A). In some examples, the weighted rope may be about ⅛ inches. In some other embodiments, the cable 160 includes a plurality of conductive segments (e.g., segmented metallic balls) 162 that may be attached to (e.g., affixed to or sown to) the circumferential edge 113 of the conductive mesh 110 (see, e.g., the cable 160-2 of FIG. 6B). The conductive (e.g., metallic) segments 162 may be located inside sown slots or pockets 164 at the edge 113 of the conductive mesh 110. In some examples, at least some of the conductive segments 162 may be replaced with magnetic segments (e.g., magnets) that magnetically couple the conductive mesh 110 to the conductive plane 140.

According to some embodiments, the conductive plane 140 includes highly electrically-conductive material, such as aluminum, copper, iron, and/or the like, to ensure adequate electrical grounding. In some examples, the conductive plane 140 has a sheet resistance of less than 1 ohm/sq meter.

Figure 7A:
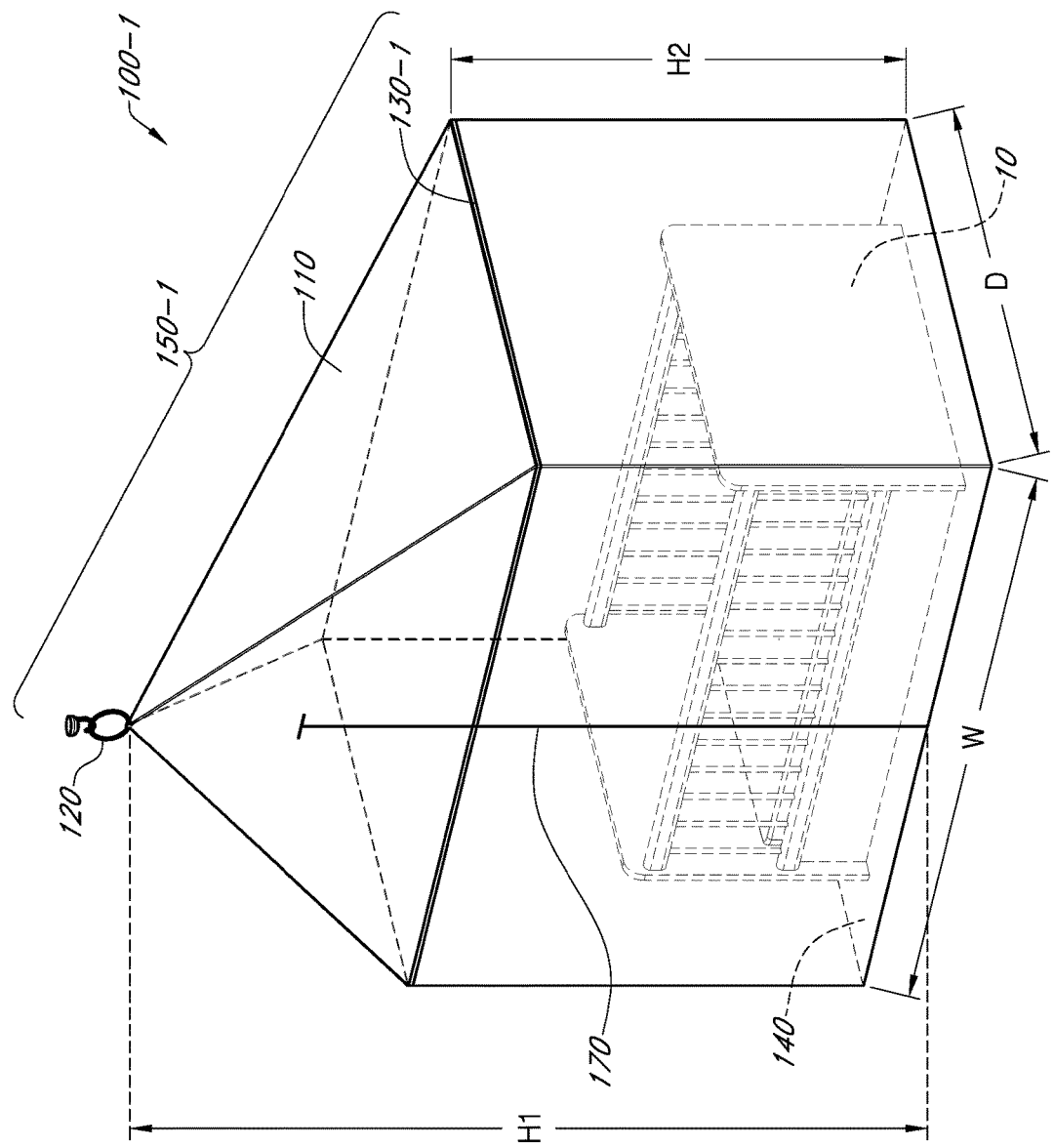
FIG. 7A illustrates a perspective view of an EMF protection system, according to some other exemplary embodiments of the present invention.
Figure 7B:
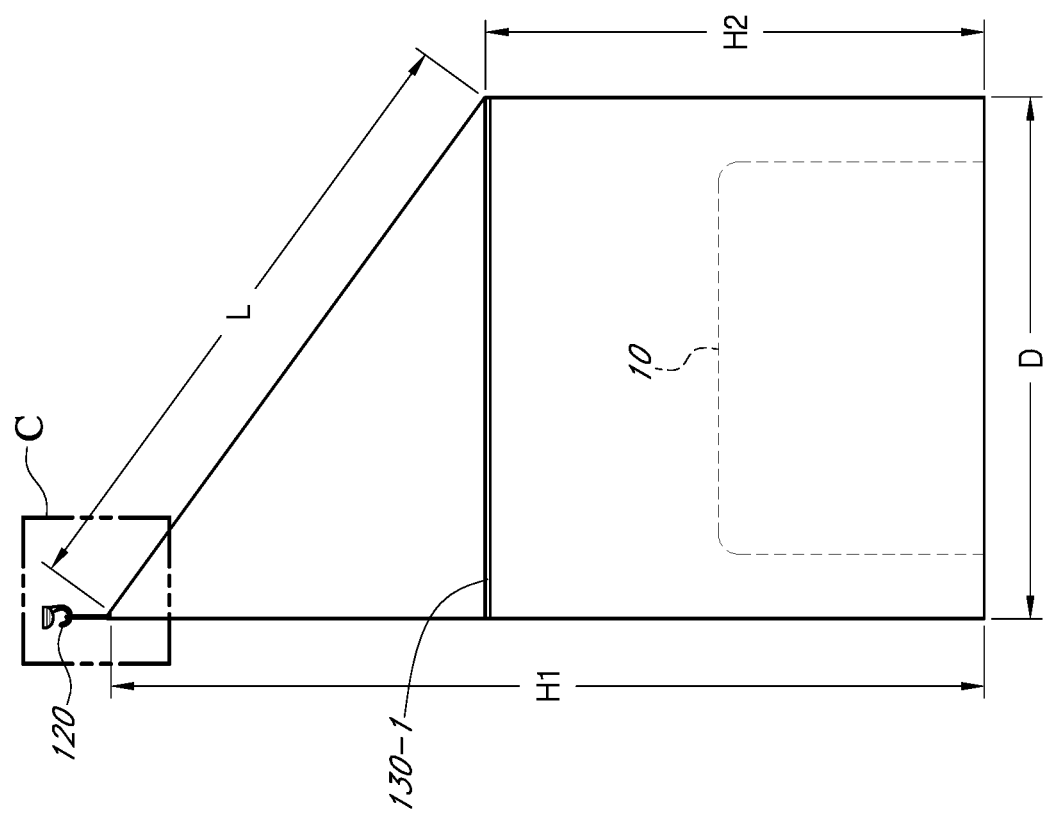
FIG. 7B illustrates a top view of the EMF protection system of FIG. 7A.

FIG. 7A illustrates a perspective view of an EMF protection system 100-1, according to some other exemplary embodiments of the present invention. FIG. 7B illustrates a top view of the EMF protection system 100-1 of FIG. 7A. FIG. 7C illustrates a closer view of the region C of FIG. 7B.

Referring to FIGS. 7A-7B, the EMF protection system (e.g., protective housing) 100-1 may be substantially the same as the EMF protection system 100 of FIG. 1, except that the conical canopy design 150 has been replaced with a prismatic canopy design 150-1. According to some embodiments, the frame (e.g., the rigid structural frame) 130-1 has a rectangular shape, which gives the conductive mesh 110 a prismatic shape.

According to some embodiments, rather than have the suspender be centrally positioned relative to the frame (as, e.g., is the case with, the EMF protection system 100 of FIGS. 1-3, the suspender 120 is mounted at or near an edge of the frame 130-1, which prevents or substantially prevents the conductive mesh 110 from sagging inwards and creates a flat (or substantially flat) vertical wall at the canopy entrance. The prismatic canopy design may increase internal volume and improve aesthetics of the EMF protection system 100-1. Further, the flat or substantially flat front plane (or front fascia) of the EMF protection system 100-1 may help to ensure that the slit 170 is completely closed without any breaks in the seal. For example, the flat or substantially flat front plane may help to ensure the proper alignment and connection of the magnets 119 along the edges 116 and 118 of the slit 170, to form a complete (e.g., unbroken) seal at the entrance of the canopy 150.

In some examples, when suspended, the frontal face of the prismatic canopy 1501-1 has a height H1 of about 72 inches to about 96 inches (e.g., about 84 inches), the back of the canopy 150-1 has a height H2 of about 36 inches to about 60 inches (e.g., about 48 inches), the depth D of the canopy 150-1 is about 38 inches to about 62 inches (e.g., about 50 inches), and the length L of the angular side of the canopy 150-1 is about 60 inches to about 84 inches (e.g., about 72 inches).

Figure 8:
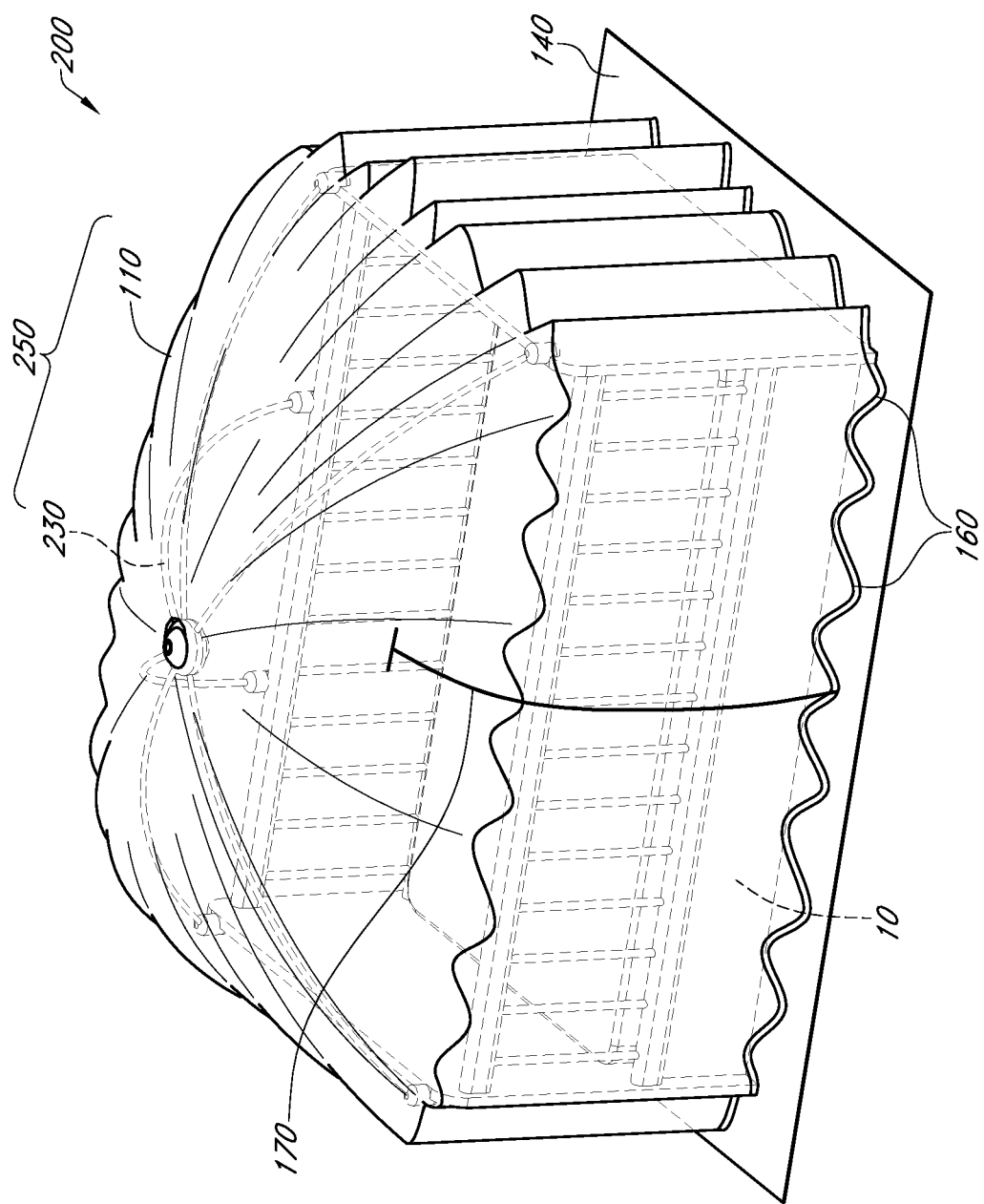
FIG. 8 illustrates a perspective view of an EMF protection system, according to still other exemplary embodiments of the present invention.
Figure 9:
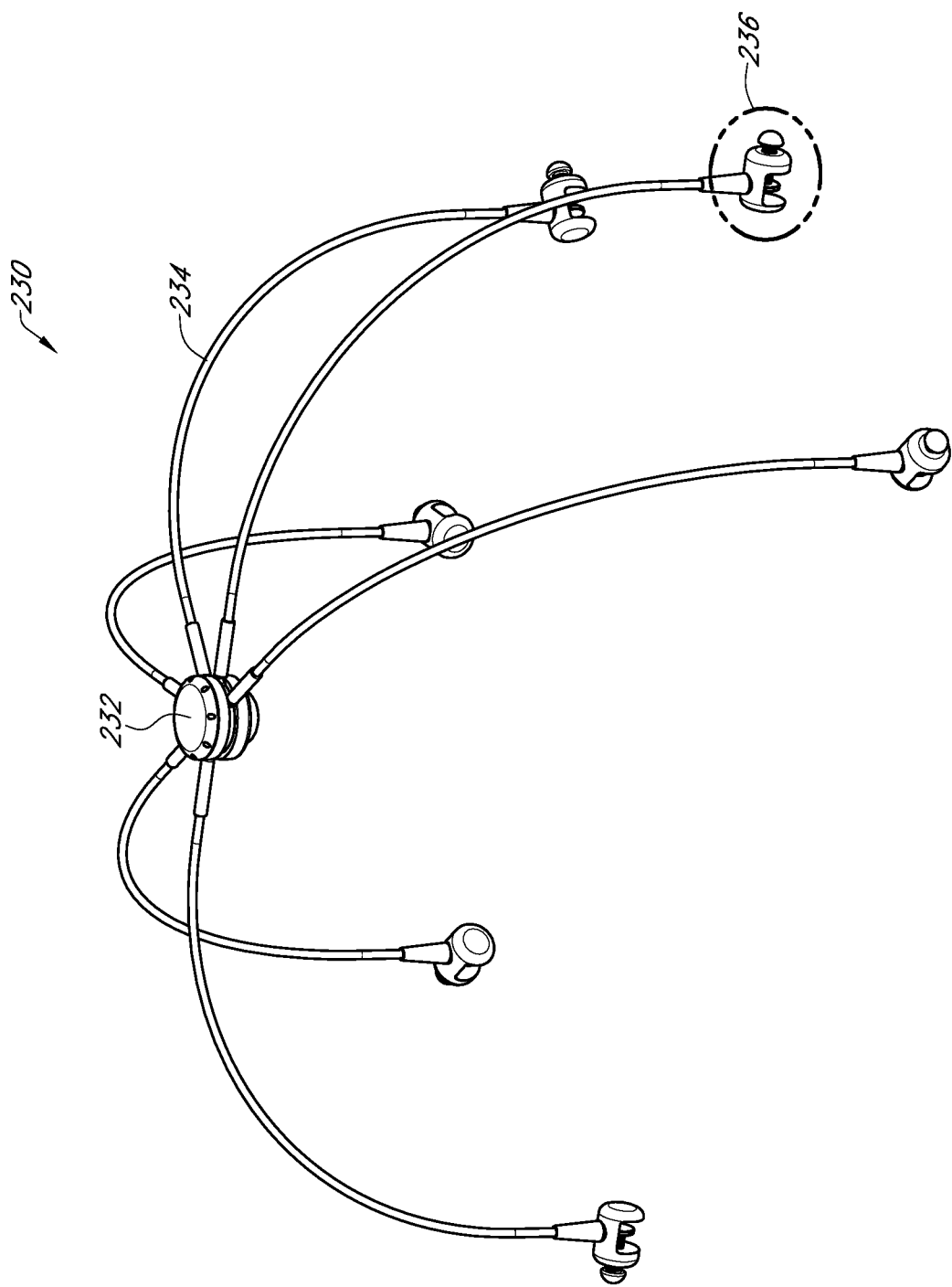
FIG. 9 illustrates a perspective view of the frame of the EMF protection system of FIG. 8.

FIG. 8 illustrates a perspective view of an EMF protection system 200, according to some exemplary embodiments of the present invention. FIG. 9 illustrates a perspective view of the frame 230 of the EMF protection system 200 of FIG. 8.

Referring to FIG. 8, the EMF protection system 200 utilizes the same or substantially the same conductive mesh 110, cable 160, conductive plane 140, and slit 170 of the EMF protection system 200. However, in the EMF protection system 200, the frame (e.g., the flexible frame or the malleable structural frame) 230 allows the conductive mesh 110 over the object 10 without being suspended from an elevated position. In some embodiments, the frame 230 acts as a malleable multi-legged stand that supports the conductive mesh 110 and defines the shape and the interior volume of the canopy 250 of the EMF protection system 200.

Referring to FIG. 9, according to some embodiments, the frame 230 includes a central body 232, a plurality of support members 234 (e.g., a plurality of malleable legs) coupled to and extending away from the central body (e.g., a central hub) 232, and a plurality of securing members (e.g., clips) 236 coupled to (e.g., fixedly coupled to) the ends of the corresponding support members 234. The securing members 236 are configured to couple (e.g., securely connect) the frame 230 to the object 10 (e.g., to the sides of the crib). In some examples, the securing member 236 may be a universal clip. According to some examples, the support member 234 may be made of a flexible/malleable material including polypropylene, polyamide, polyethylene, and or the like.

In some examples, the conductive mesh 110 may be secured to (e.g., attached to) the central body 232 (e.g., via compressive force of two components of the central body 232) and contour over the support members 234. In some examples, the conductive mesh 110 may be kept in place by a piece of velcro that sticks to the opposing end of the velcro strip located at the top of the central body 232.

Figure 10A:
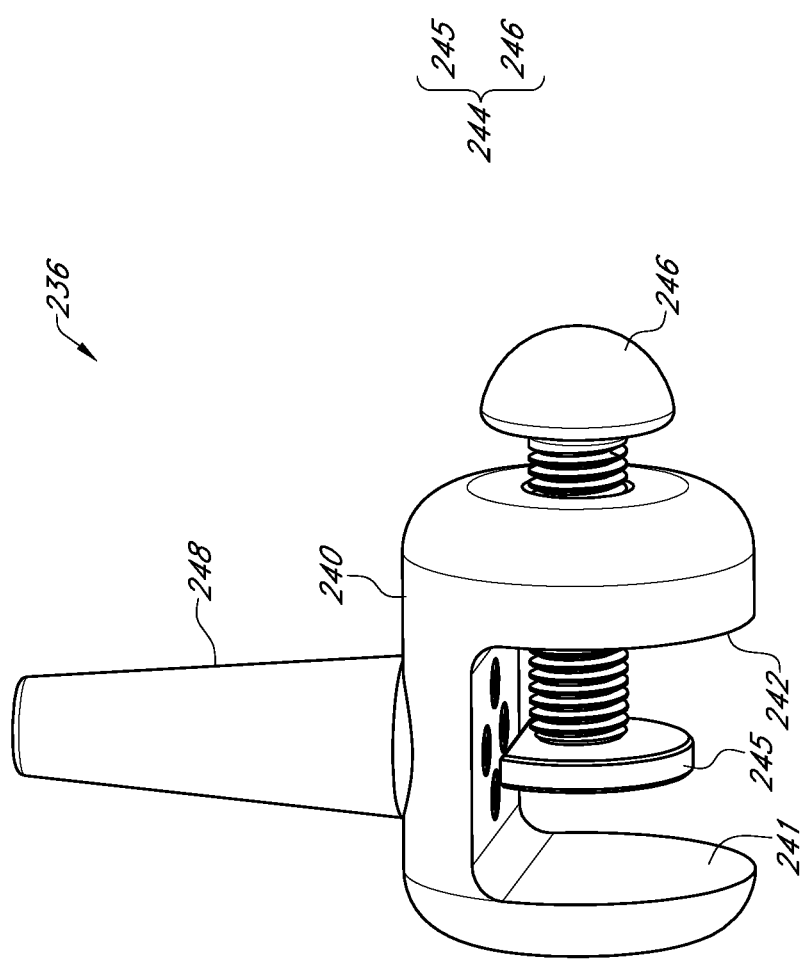
FIG. 10A illustrates a perspective view of the securing member, according to some exemplary embodiments of the present invention.

FIG. 10A illustrates a perspective view of the securing member 236, according to some exemplary embodiments of the present invention. FIG. 10A illustrates an exploded perspective view of the securing member 236 of FIG. 10A.

Figure 10B:
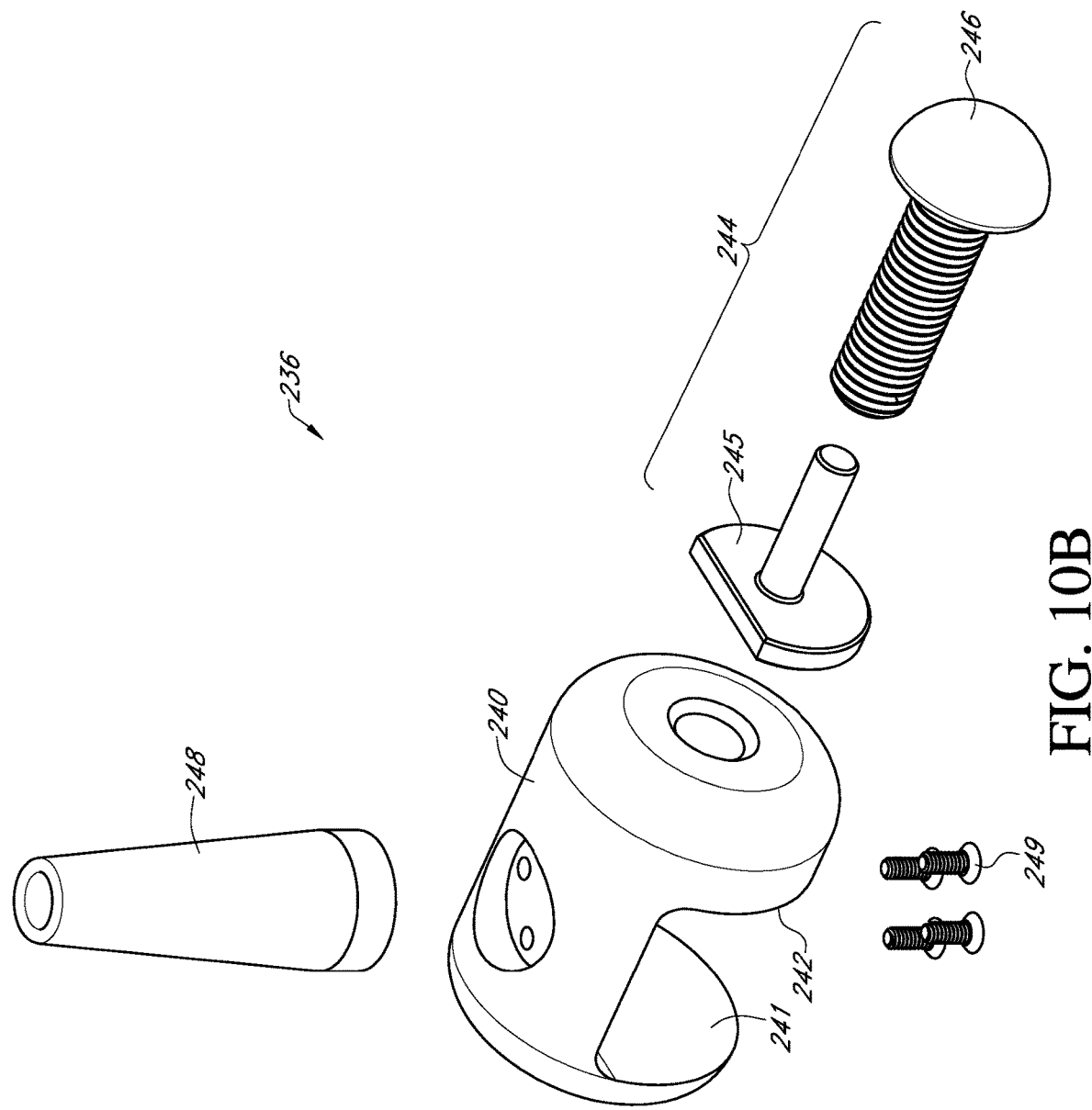
FIG. 10B illustrates an exploded perspective view of the securing member of FIG. 10A.

Referring to FIGS. 10A-10B, the securing member 236 includes a main body 240 having opposing lips 241 and 242 protruding away from the main body 240 and configured to surround a side (e.g., a side frame/rail) of the object (e.g., a crib) 10. The securing member 236 also includes a fastening mechanism (e.g., a set screw) 244 having a flat head 245 moveable between the opposing lips 241 and 242 and having an adjustable head 246 for adjusting the position of the flat head 245 between the opposing lips 241 and 242. The securing member 236 may become fixedly coupled to the object 10 by adjusting the adjustable head 246 (e.g., via a rotating tool, such as a screw driver) to firmly clamp (e.g., clasp) the object (e.g., a side of the object) 10 between the lip 241 and the flat head 245. The securing member 236 further includes a sleeve portion 248 for encompassing and coupling to an end of a corresponding supporting member 234. The sleeve portion 248 may be coupled to the main body 240 via one or more screws 249. In some examples, the sleeve 248 may be sufficiently tall such that when the supporting member 234 is inserted into the sleeve 248 and bent, the warping of the supporting member 234 secures it in place inside the sleeve 248.

Figure 11A:
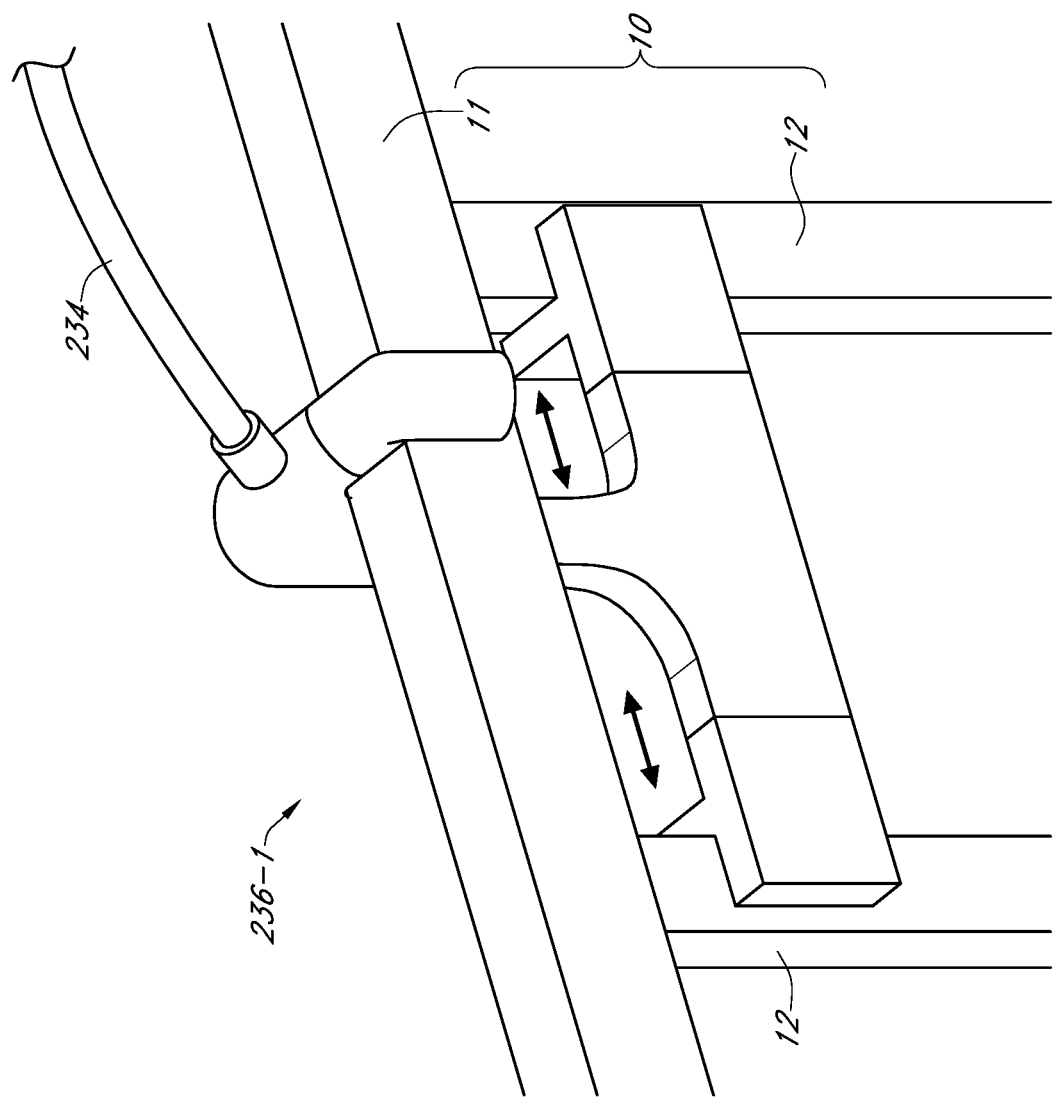
FIG. 11A illustrates a perspective view of the securing member firmly secured to an object, according to some other exemplary embodiments of the present invention.
Figure 11B:
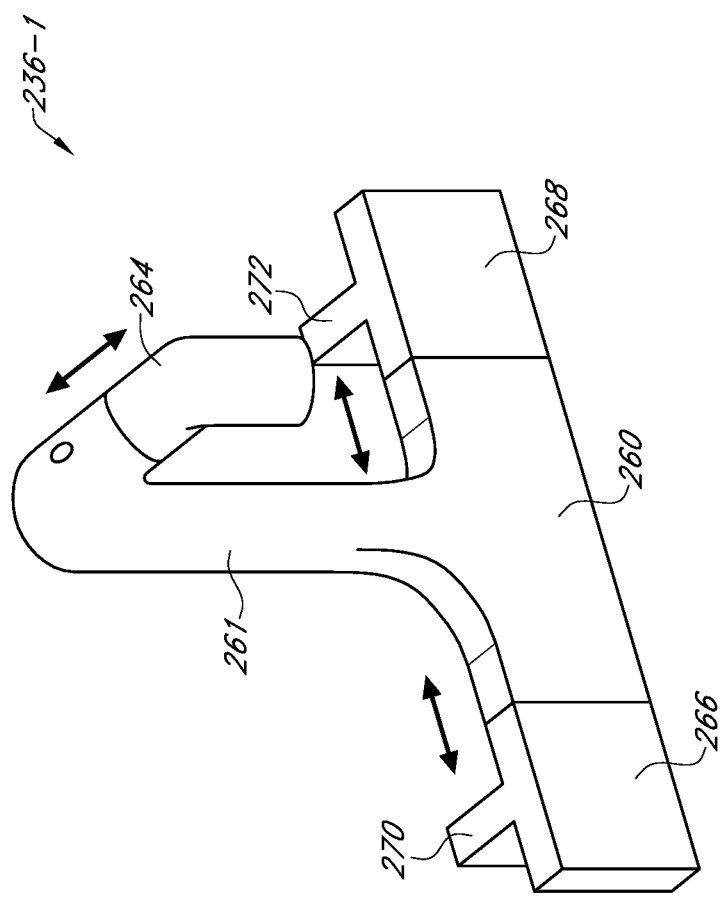
FIG. 11B illustrates a perspective view of a front of the securing member of FIG. 11A.
Figure 11C:
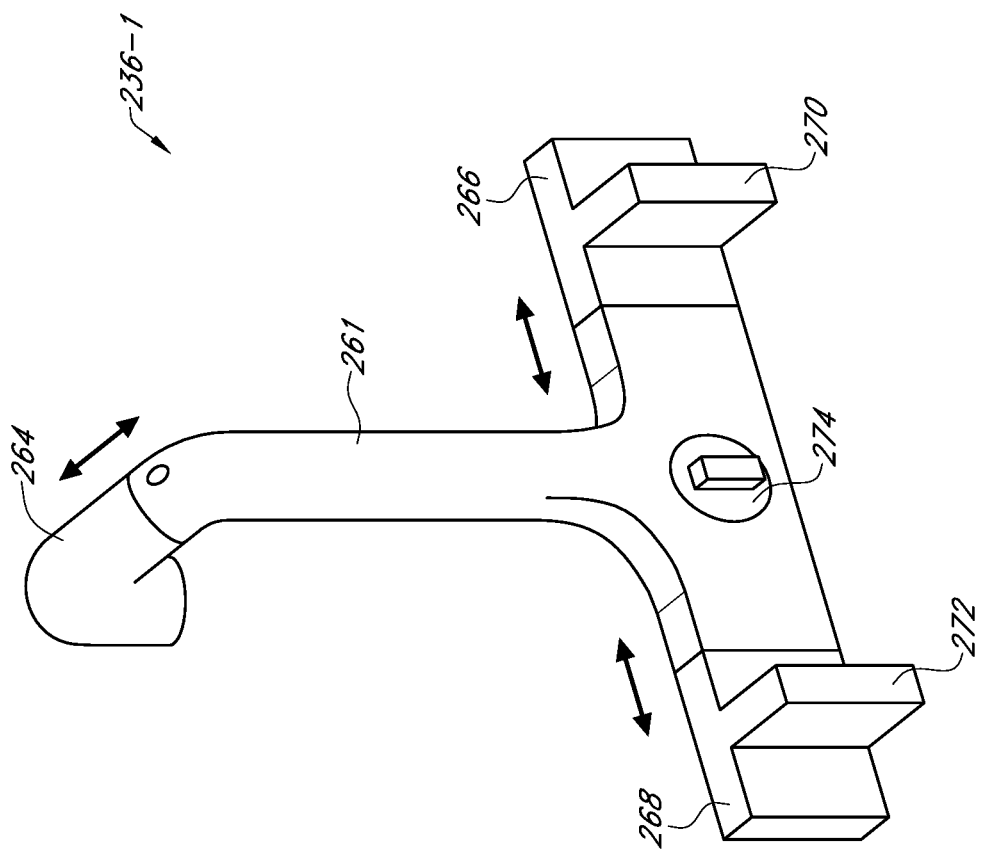
FIG. 11C illustrates a perspective view of a back of the securing member of FIG. 11A.
Figure 11D:
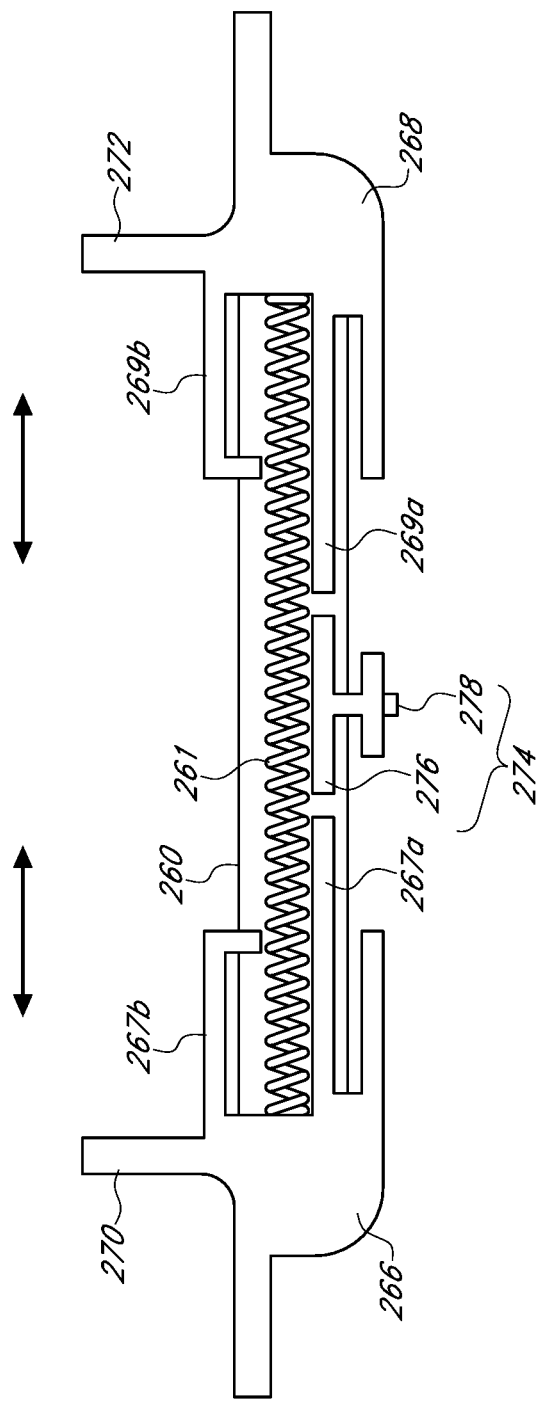
FIG. 11D illustrates a cross-sectional view of the internal mechanism of the securing member of FIG. 11A, according to some exemplary embodiments of the present invention.
Figure 11F:
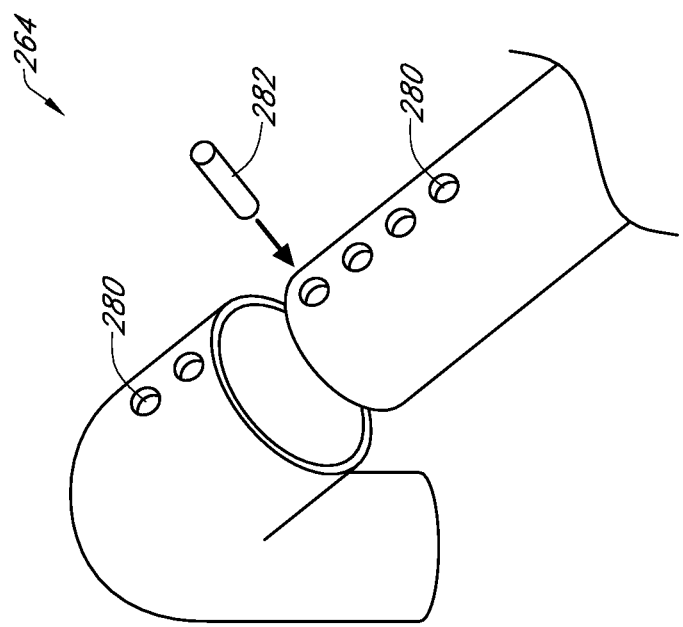
FIG. 11F illustrates the telescopic adjustability of the overhanging hook of the securing member of FIG. 11A, according to some exemplary embodiments of the present invention.
Figure 11E:
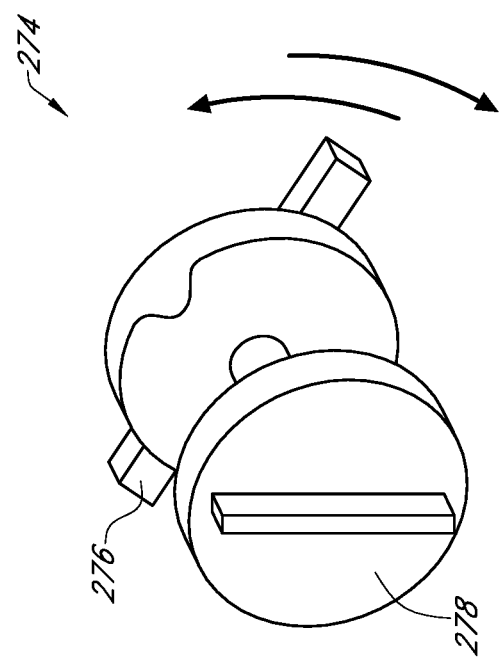
FIG. 11E illustrates a locking mechanism of the securing member, according to some exemplary embodiments of the present invention.

FIG. 11A illustrates a perspective view of the securing member 236-1 firmly secured to an object 10, according to some other exemplary embodiments of the present invention. FIG. 11B illustrates a perspective view of a front of the securing member 236-1 of FIG. 11A. FIG. 11C illustrates a perspective view of a back of the securing member 236-1 of FIG. 11A. FIG. 11D illustrates a cross-sectional view of the internal mechanism of the securing member 236-1 of FIG. 11A, according to some exemplary embodiments of the present invention. FIG. 11E illustrates a locking mechanism 274 of the securing member 236-1, according to some exemplary embodiments of the present invention. FIG. 11F illustrates the telescopic adjustability of the overhanging hook 264 of the securing member 236-1 of FIG. 11A, according to some exemplary embodiments of the present invention.

Referring to FIGS. 11A-11C, according to some embodiments, the securing member (e.g., clamp) 236-1 includes a clamp body 260 (which may have an elongated neck portion 262) and an overhanging telescopic hook 264 extending from the clamp body 260 (e.g., extending from the elongated neck portion 262), and a pair of resilient arms (e.g., spring-loaded lateral arms) 266 and 268 extending laterally from opposing sides of the clamp body 260. In some embodiments, the overhanging telescopic hook 264 is configured to engage (e.g., attach to) the top of a horizontal beam (e.g., side rail of a crib/basinet) 11 of the object 10, and the resilient arms 266 and 268 are configured to engage the vertical bars 12 of the object 10 by apply opposing lateral forces against a pair of (e.g., an adjacent pair of) vertical bars 12 via a pair of protrusions (e.g., tabs) 270 and 272 protruding from the resilient arms 266 and 268. In some examples, the protrusions 270 and 272 may extend in a direction orthogonal to the extension direction of the resilient arms 266 and 268.

Referring to FIGS. 11A-11E, according to some embodiments, the securing member 236-1 further includes a locking mechanism that locks the lateral position of the resilient arms 266 and 268 and prevents the accidental release or loosening of the securing member 236-1 (by, e.g., an infant or baby).

Referring to FIGS. 11D-11E, according to some embodiments, the clamp body 260 includes a resilient element (e.g., compressive element or spring), which may apply a lateral force against the pair of resilient arms 266 and 268 to push them apart, when in a compressed state. Each of the resilient arms 266 and 268 includes a first stopper 267a/269a that extends inward toward the locking mechanism 274. The locking mechanism 274 includes a stopper bar 276 that can be rotated by the rotating action of the knob 278. When in a locked state, the stopper bar 276 may extend in the extension direction of the first stoppers 267a and 269a and prevent inward movement of the pair of resilient arms 266 and 268 beyond a first set point. When in an unlocked state, the stopper bar 276 may be at an angle relative to (e.g., orthogonal to) the extension direction of the first stoppers 267a and 269a and allow inward movement of the pair of resilient arms 266 and 268 beyond the first set point. In some embodiments, each of the resilient arms 266 and 268 includes a second stopper (e.g., a max stopper) 267/269b that extends inward and limits the maximum inward travel distance of the corresponding resilient arm 266/268.

Referring to FIGS. 11A and 11F, in some embodiments, the overhanging telescopic hook 264 includes two pieces each having one or more holes 280 that can be locked together using a pin 282. The combination of the holes 280 and pin 282 also allow the overhanging telescopic hook 264 to have telescopic adjustability (e.g., to have an adjustable length).

Figure 12A:
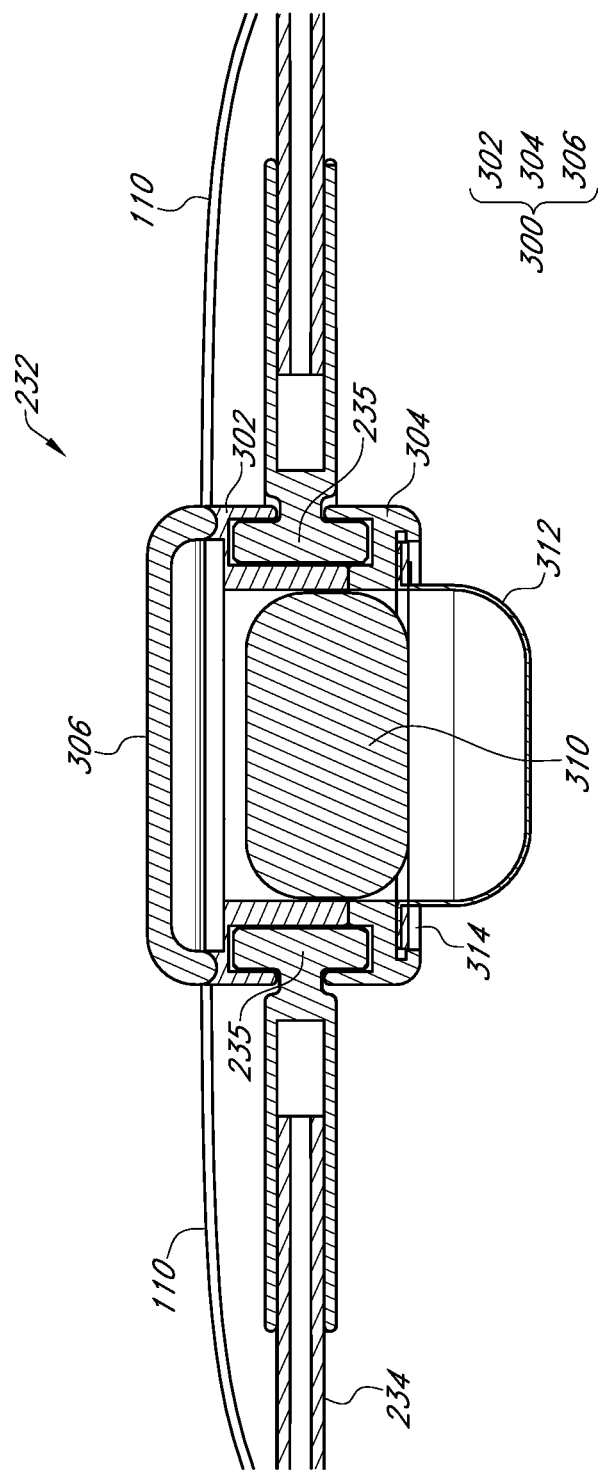
FIG. 12A illustrates a cross-sectional view of the internal structure of the central hub, according to some embodiments of the present invention.
Figure 12B:
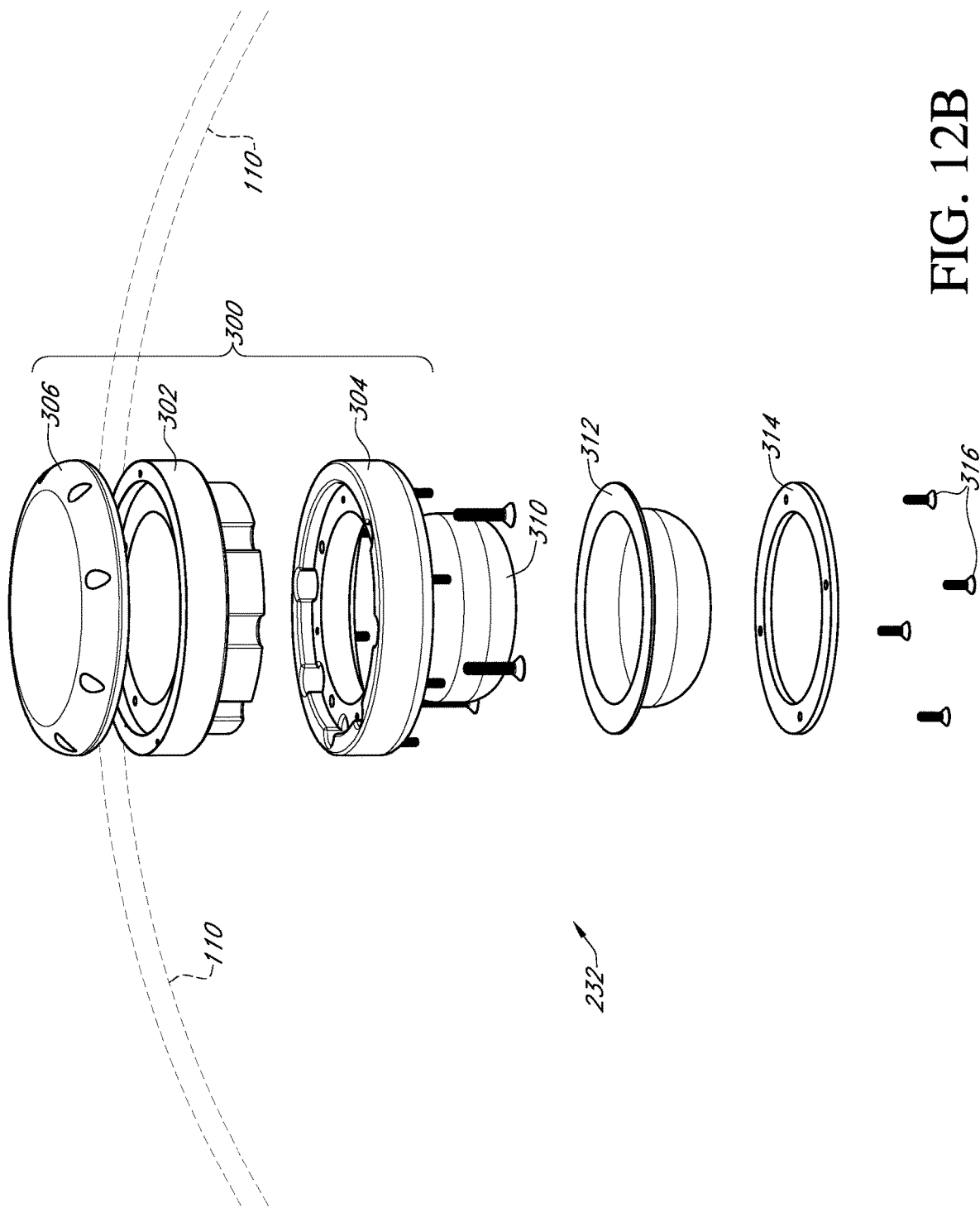
FIG. 12B illustrates an exploded perspective view of the central hub of FIG. 12A.

FIG. 12A illustrates a cross-sectional view of the internal structure of the central body 232, according to some embodiments of the present invention. FIG. 12B illustrates an exploded perspective view of the central body 232 of FIG. 12A.

Referring to FIGS. 12A-12B, in some embodiments, the central body 232 includes a housing 300 and a sensing device (e.g., a camera) 310 secured to (e.g., partially within) within the housing 300 and configured to monitor the interior of the canopy 250 (e.g., monitor an individual within the canopy 250). The housing 300 includes a first portion 302, a second portion 304 configured to accommodate (e.g., mate with) the first portion 302, and a cap 306 positioned above the first and second portions 302 and 304. In some embodiments, the first and second portions 302 and 304 define therein a plurality of cavities that are configured to accommodate the ends 235 of the plurality of support members 234 and to, thereby, couple the plurality of support members 234 to the central body 232. The ends 235 of each of the support members 234 may be a ball bearing joint that allow for adjustability and movement of the support member 234 in any direction.

An optical dome 312, which may act as transparent bottom cover for the housing 300, may be affixed to the housing 300 via a ring 314 and a plurality of fasteners (e.g., screws) 316. The optical dome 312 may secure the sensing device 310 within the housing while exposing (e.g., visibly exposing) the interior of the canopy 250 for monitoring by the sensing device 310. In some embodiments, the central body 232 partially penetrates the canopy 250 through an opening in the conductive mesh 110. The central body 232 may be coupled to the conductive mesh 110 by sandwiching portions of the conductive mesh 110 that are near the opening between the cap 306 and the first portion 302. Thus, while the first and second portions 302 and 304 may be positioned within the canopy 250, when assembled, the cap may reside outside of the canopy 250. In some embodiments, portions of the housing 300 that are exposed to the interior of canopy 250 may be coated with a conductive layer in order to improve the shielding effect of the canopy 250, and to reduce or minimize the penetration of radiations from the sensing device 310 within the interior of the canopy 250. In some examples, the cap 306, which resides outside of the canopy 250, does not include any conductive material in order to facilitate the wireless transmission of data to and from the sensing device 310.

According to some embodiments, the sensing device 310 includes a camera, a microphone and speaker for providing audio in/out capabilities, and/or a carbon monoxide detector. The camera may be battery powered and may have night vision capabilities up to about 5 feet. The sensing device 310 includes a wireless transceiver for enabling wireless communication with a remote device (e.g., a mobile handheld device) external to the protective housing. The sensing device 310 may be wirelessly connected to an app available on the remote device (e.g., a smartphone or tablet). The video from the camera may be transmitted (e.g., instantly streamed) to the remote device for display to a user, and the sensing device 310 may be remotely controlled via the app. The audio capabilities may include playing a number of pre-programmed audio files, such as white noise and calming nature sounds, which can also be remotely controlled via the app. In some embodiments, the sensing device 310 includes a monitoring sensor configured to indicate to the user, via the app, when the canopy has been sufficiently closed and the desired EMF cancellation has been achieved.

While this invention has been described in detail with particular references to exemplary embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

It will be understood that, although the terms "first", "second", "third", etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including", "comprises", and/or "comprising", when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items. Expressions such as "at least one of", when preceding a list of elements, modify the entire list of elements and do not modify the individual elements of the list. Further, the use of "may" when describing embodiments of the inventive concept refers to "one or more embodiments of the inventive concept". Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. When an element or layer is referred to as being "directly on", "directly connected to", "directly coupled to", or "immediately adjacent to" another element or layer, there are no intervening elements or layers present.

As used herein, the terms "use", "using", and "used" may be considered synonymous with the terms "utilize", "utilizing", and "utilized", respectively.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

As used herein, the term "substantially," "about," and similar terms are used as terms of approximation and not as terms of degree, and are intended to account for the inherent variations in measured or calculated values that would be recognized by those of ordinary skill in the art. Further, a specific quantity or range recited in this written description or the claims may also encompass the inherent variations in measured or calculated values that would be recognized by those of ordinary skill in the art.

The sensing device module and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the sensing device may be formed on one integrated circuit (IC) chip or on separate IC chips. Further, the various components of the sensing device may be implemented on a flexible printed circuit film, a tape carrier package (TCP), a printed circuit board (PCB), or formed on a same substrate. Further, the various components of the sensing device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

What is claimed is:

1. A protective housing for shielding an individual against electro-magnetic field (EMF) radiation, the protective housing comprising:
    a conductive mesh configured to be suspended from an elevated position;
    a conductive plane at a base of the protective housing and configured to be a grounding plane for the protective housing, the conductive plane and conductive mesh being configured to shield an interior space, defined by the conductive plane and conductive mesh when suspended, against EMF radiation; and
    a cable coupled to a circumference of the conductive mesh and configured to weigh down the conductive mesh and to electrically couple the conductive mesh to the conductive plane.

2. The protective housing of claim 1, wherein the conductive mesh comprises:
    a first conductive layer; and
    a second conductive layer overlapping with a portion of the first conductive layer,
    wherein the first conductive layer has a smaller mesh size and greater conductivity than the second conductive layer.

3. The protective housing of claim 1, wherein the conductive mesh has a mesh size configured to permit the conductive mesh to be flexible to drape around an object placed within the interior space and to be breathable and see-through.

4. The protective housing of claim 1, wherein the conductive mesh comprises:
    a flexible and breathable fabric having an electrically-conductive coating, the flexible and breathable fabric comprising at least one of a polyamide, a polyester, cotton, polyethylene, and polypropylene, and the electrically-conductive coating comprises at least one of silver (Ag), gold (Au), aluminum (Al), copper (Cu), chromium (Cr), iron (Fe), manganese (Mn), tin (Sn), titanium (Ti), tungsten (W), platinum (Pt), nickel (Ni), cobalt (Co), barium (Ba), indium (In), palladium (Pd), bismuth (Bi), niobium (Nb), selenium (Se), zinc (Zn), vanadium (V), mercury (Hg), and cadmium (Cb).

5. The protective housing of claim 1, wherein the conductive mesh has a slit formed by a first edge and a second edge of the conductive mesh, the slit providing an opening to the interior space when the conductive mesh is suspended, the first and second edges being configured to be coupled together to close the opening.

6. The protective housing of claim 5, wherein each of the first and second edges of the slit comprises a plurality of magnets positioned along a corresponding one of the first and second edges, the plurality of magnets comprising an alternating pattern of shorter and stronger magnets and longer and weaker magnets.

7. The protective housing of claim 6, wherein each one of the plurality of magnets being attached to the conductive mesh by being secured within sown slots along a corresponding one of the first and second edges.

8. The protective housing of claim 1, wherein the cable comprises:
    an electrically-conductive weighted rope.

9. The protective housing of claim 1, wherein the cable comprises:

a plurality of conductive segments positioned within corresponding slots along a circumferential edge of the conductive mesh.

10. The protective housing of claim 1, wherein the cable comprises:
a plurality of magnetic segments positioned within corresponding slots along a circumferential edge of the conductive mesh.

11. The protective housing of claim 1, further comprising:
a suspender configured to suspend the conductive mesh from the elevated position, the suspender comprising a ring affixed to an end of the conductive mesh and an eyelet configured to be coupled to the ring and to the elevated position.

12. The protective housing of claim 1, further comprising:
a frame coupled to the conductive mesh and configured to define a shape of conductive mesh.

13. The protective housing of claim 12, wherein the frame has a circular shape, an oval shape, a rectangular shape, a trapezoidal shape, or a pentagonal shape.

14. The protective housing of claim 12, wherein the frame comprises:
a central body configured to be coupled to the conductive mesh;
a plurality of support members rotatably coupled to and extending away from the central body; and
a plurality of securing members coupled to corresponding ones of the plurality of support members and configured to securely couple the frame to an object within the interior space.

15. The protective housing of claim 14, wherein the central body is configured to be coupled to the conductive mesh, and
wherein the conductive mesh is configured to drape over the plurality of support members.

16. The protective housing of claim 14, wherein each of the plurality of securing members comprises:
a main body having opposing lips protruding away from the main body and configured to surround a side of the object; and
a fastening mechanism having a flat head configured to move between the opposing lips and having an adjustable head configured to adjust a position of the flat head between the opposing lips,
wherein the securing member is configured to become fixedly coupled to the side of the object in response to an adjustment of the adjustable head, via a rotating tool, to clamp the side of the object between the lip of the opposing lips and the flat head.

17. The protective housing of claim 16, wherein each of the plurality of securing members further comprises:
a sleeve portion configured to encompass and couple to an end of a corresponding one of the plurality of supporting members, the sleeve portion being coupled to the main body via one or more screws.

18. The protective housing of claim 14, wherein each of the plurality of securing members comprises:
a clamp body;
an overhanging telescopic hook extending from the clamp body and configured to engage a horizontal beam of the object; and
a pair of resilient arms extending laterally from opposing sides of the clamp body and configured to engage vertical bars of the object.

19. The protective housing of claim 18, wherein each of the pair of resilient arms has a protrusion extending from a corresponding resilient arm of pair of resilient arms in a direction orthogonal to an extension direction of the corresponding resilient arm, and
wherein the pair of resilient arms are configured to engage the vertical bars of the object by apply opposing lateral forces against the vertical bars via the protrusions.

20. The protective housing of claim 14, wherein the central body comprises:
a sensing device configured to monitor the interior space of the protective housing and to be in wireless communication with a remote device external to the protective housing.

* * * * *